United States Patent [19]

Smith et al.

[11] 4,093,995

[45] June 6, 1978

[54] RANDOM ACCESS MEMORY APPARATUS FOR A WAVEFORM MEASURING APPARATUS

[75] Inventors: Steven R. Smith; Frederick A. Rose, both of Fort Atkinson, Wis.

[73] Assignee: Norland Corporation, Fort Atkinson, Wis.

[21] Appl. No.: 670,890

[22] Filed: Mar. 26, 1976

[51] Int. Cl.² .................... G06F 3/14; G06F 13/06; G06F 3/05

[52] U.S. Cl. .......................... 364/900; 340/324 A

[58] Field of Search ........ 340/172.5, 324 A, 324 AD; 315/365; 364/900 MS File, 200 MS File

[56] References Cited

U.S. PATENT DOCUMENTS 3,786,476  1/1974  Graves ........................... 340/324 A

*Primary Examiner*—James D. Thomas
*Attorney, Agent, or Firm*—Andrus, Sceales, Starke & Sawall

[57] ABSTRACT

A waveform measuring and display instrument includes a random access data memory bank consisting of four similar data memory parts, which can be configured or organized as one single memory section, two individual half sections, or four individual sections. Each part has an input port coupled by a multiplexer to any one of a plurality of waveform data acquisition plug-in units. During data acquisition, a controller includes a direction memory which sets the multiplexer to establish a connection of the signal inputs to the memory parts. The direction memory is written by the processor in accordance with the setting of a user operated control means for selection of the memory configuration. A CRT display unit is connected to a display port for reading the data memory. A logical address is employed by processor and display unit for any given memory section to identify the desired logical memory location starting from a logical zero reference. The data memory unit includes an offset register for each part. The appropriate offset register is updated with each data sample input to track the offset of the logical address zero reference from the physical zero reference of the part or section. Where the data memory is configured with a plurality of parts forming a section, one offset register may be assigned to the section or the individual registers may be employed. A logic means provided in the memory unit calculates the physical location for the logical address based on the offset number in the register and the size of the array.

14 Claims, 7 Drawing Figures

RANDOM ACCESS MEMORY APPARATUS FOR A WAVEFORM MEASURING APPARATUS

BACKGROUND OF THE INVENTION

This invention relates to a waveform measuring and analyzing apparatus having a digital memory means in which digitized waveform samples are stored and having display means reading said memory means and visually displaying the stored waveform.

Oscilloscopes and transient recorders are employed in the measurement and analysis of changing physical phenomena. The changes being analyzed may be repetitive or transient. Generally, a transducer develops an analog voltage signal in accordance with a sensed physical phenomena.

Digital oscilloscopes and transient recorders include means for digitizing a waveform signal, storing such digitized data in a digital memory and reproducing a replica of the signal from such stored data.

A particularly satisfactory and improved waveform measuring and analyzing instrument incorporating all the characteristics of digital oscilloscopes and transient recorders and in addition a resident signal processing capability is disclosed in the copending application of Frederick A. Rose entitled "WAVEFORM MEASURING MEANS WITH RESIDENT PROGRAMMED PROCESSOR FOR CONTROLLED WAVEFORM DISPLAY AND WAVEFORM DATA REDUCTION AND CALCULATION" filed on Mar. 26, 1976, with Ser. No. 670,703, and assigned to the same assignee.

As more fully disclosed in the above application, the instrument includes a digital memory unit to store digitized waveform samples for display on a monitor oscilloscope or CRT screen. The most current digitized data is introduced into the memory location corresponding to the right edge of the display means and old data is erased from the left edge as the new data comes in. During display, the waveform thus marches across the screen from right to left. The memory unit is preferably constructed with a plurality of sections in which different waveforms may be stored. The display unit is operable to display such waveforms in vertically spaced relation on the screen for proper analysis of the physical event. A display selection control permits user selection of the memory sections for display. The memory unit and the display unit include suitable controllers for writing and reading memory data with the data transferred over a controlled hardwired interface for rapid transfer. The instrument further includes a resident, special programmed processor having a read/write connection to the memory unit. An integrated interactive keyboard is also provided for user operated data reduction and includes user operated keys which actuate the resident processor to execute an appropriate one of a plurality of corresponding program routines in the processor memory to do appropriate data reduction and calculation on the waveform array data in memory. The reduced waveform data is stored in an appropriately sized memory array of the memory unit.

The memory unit is preferably a random access memory having memory locations in which the waveform values are stored and are sequentially read by a display interfacing means which operates the display means. For various waveforms, different sized arrays may be desirable. However, to provide such different sized arrays would significantly increase the cost of the memory.

SUMMARY OF THE INVENTION

The present invention is particularly directed to a digital random access memory means of a waveform measuring instrument in which one or more waveforms are stored as a series of digitized waveform samples. In accordance with the present invention, the random access memory means includes a plurality of distinct physical parts which can be configured as a single memory array or section for storing one waveform or as a plurality of individual separate memory arrays for storing individual waveforms. The random access memory means includes a plurality of input ports, one input port being provided for each part. A user operated control means permits selection of the desired array or section which includes all or only certain of the parts. A controller connects the memory input ports to the source of digitized samples and transmits the data samples to the appropriate parts in accordance with the section or array established by the user operated configuration control means. Data is continuously introduced into the configured memory means during the sampling of a waveform, with the last point of an array constituting the newest data and appearing in the last logical address in the array. The newest data sample is placed in a filled array by erasing the oldest data sample, which corresponds to the first logical address location of the array.

The newest digitized data is thereby placed in physical memory locations based on the location of the last sample and thus each location is determined by the states of the address lines at that time. The data sampling of a waveform may be terminated at an arbitrary time and the physical location of the last sample may, therefore, be any one of the total possible locations in the array. As a result, the physical location of any data point may be logically identified by using the offset of the last location of data storage within the array from the zero or first physical location of the array. In accordance with the present invention, the memory unit includes an offset storage means which is updated with each data sample input to track the offset number for the selected array. The logical address is employed by the processor and display unit for any given array size to identify the desired memory address starting from a zero reference. A logic means provided in the memory unit calculates the physical location for that logical address based on the offset number in the register and the size of the array.

A practical and unique embodiment of the waveform display instrument employs a CRT or monitor oscilloscope. A memory bank of 4096 words, of 12 bits each, for example, physically including four similar parts can be configured or organized as one single memory section, two individual half sections or four individual sections. Each part has a 12 bit input port coupled by a multiplexer to any one of several signal data acquisition waveform signal inputs. A 12 bit wide display port and an 8 bit wide processor port are suitably connected to read the memory sections. An address logic unit includes individual offset registers for each memory part. A memory input controller includes a control table which sets the multiplexer to establish a hardwired connection of the signal inputs in sequence to the four memory sections, with any port connected to any part. The table is written by the processor in accordance with setting of user operated selection control means.

The selection control means determines the memory configuration and the processor sets the appropriate registers to update the offset data registers for proper calculation of the related logical addresses. Where the memory is configured as a single total array, the last data sample may appear in any location in the total memory depending upon the time waveform sampling was terminated. A single one of the offset registers may be set to record the offset value. Similarly, where the parts are organized into two halves, a separate offset register may be assigned for each section. Each register then maintains a record of the offset position of its section and therefore the relationship between the physical and the logical arrays. Alternatively, all registers may be employed in the configured combinations and may then be set with the same values for any section or array. In this mode, the first two physical parts define the first half memory and the data samples may appear in any locations within such two parts. The third and fourth parts define the second half memory and data samples may appear in any location within such two parts. Where the memory is configured to separately store data in the four parts, four registers are used to store the four offsets in the four separate arrays or sections. The display unit and the processor having memory address buses which are combined with the output buses of the offset registers in the address calculating logic means to convert the logical addresses into the appropriate physical address in the memory bank. The logic address calculating means includes a four to one multiplexer for selection of the appropriate offset register, when the processor or the display unit is addressing memory. The multiplexer is set by a request section logic which includes a first input identifying the input mode, that is, the organization of the memory as a single whole memory, two half memories or four quarter memories. A second input is connected to the logical address bus from the processor or the display unit. The output of the appropriate register is then added to the logical address to define the actual physical location in the particular array. Thus, the memory bank of this embodiment may be selectively configured in any one of three distinct separate physical organizations as if three distinct and separate different sized memory units were provided. The size of the memory bank including the number of parts and their sizes as well as the number and manner of arranging the sections may, of course, be designed for any specifications or requirements. The present invention permits the convenient implementation of a data memory using random access and particularly allows the cycling multiple channels of signals into a single data memory unit which is configured in accordance with the input data requirements or configuration.

The present invention thus provides a relatively inexpensive and efficient system of entering sequential data into a digital random access memory where various sizes of memory may be required at different periods of use.

BRIEF DESCRIPTION OF THE DRAWINGS

The drawings furnished herewith illustrate the best mode presently contemplated for carrying out the invention in which the above advantages and features are clearly disclosed as well as others which will be readily understood from the following description of such embodiment.

In the drawings.

DESCRIPTION OF ILLUSTRATED EMBODIMENT

Figure 1:
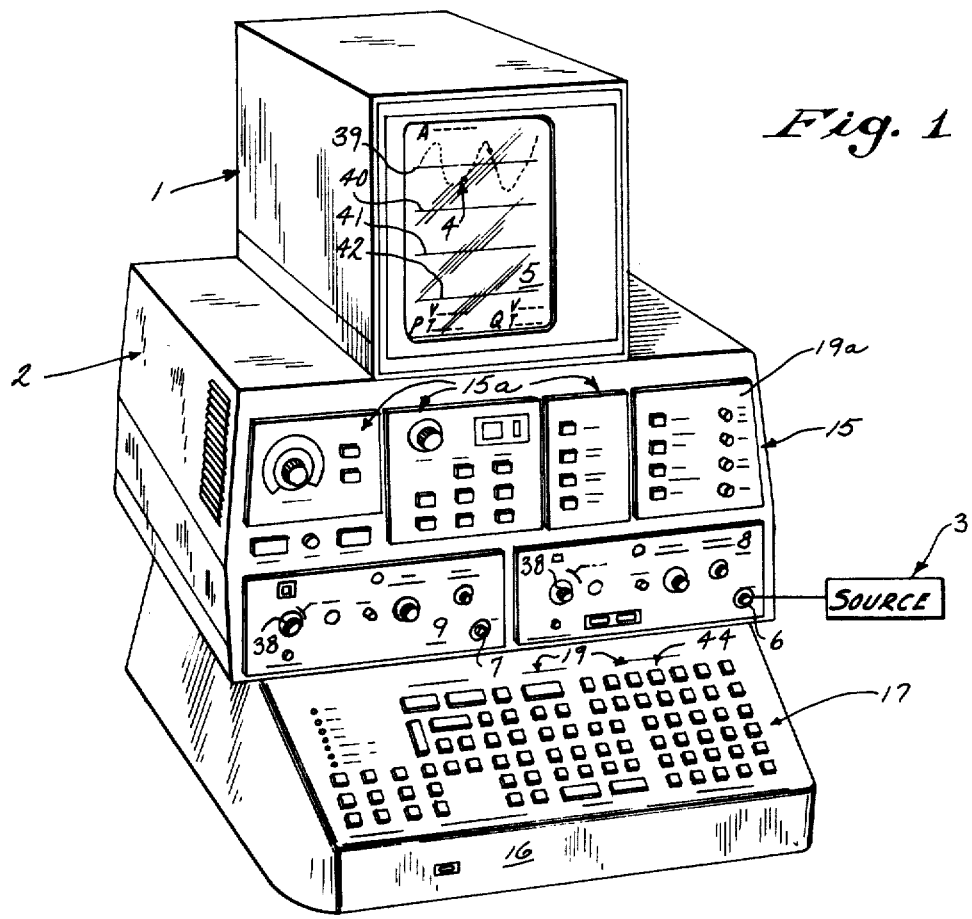
FIG. 1 is a pictorial view of an instrument constructed in accordance with the present invention.
Figure 3:
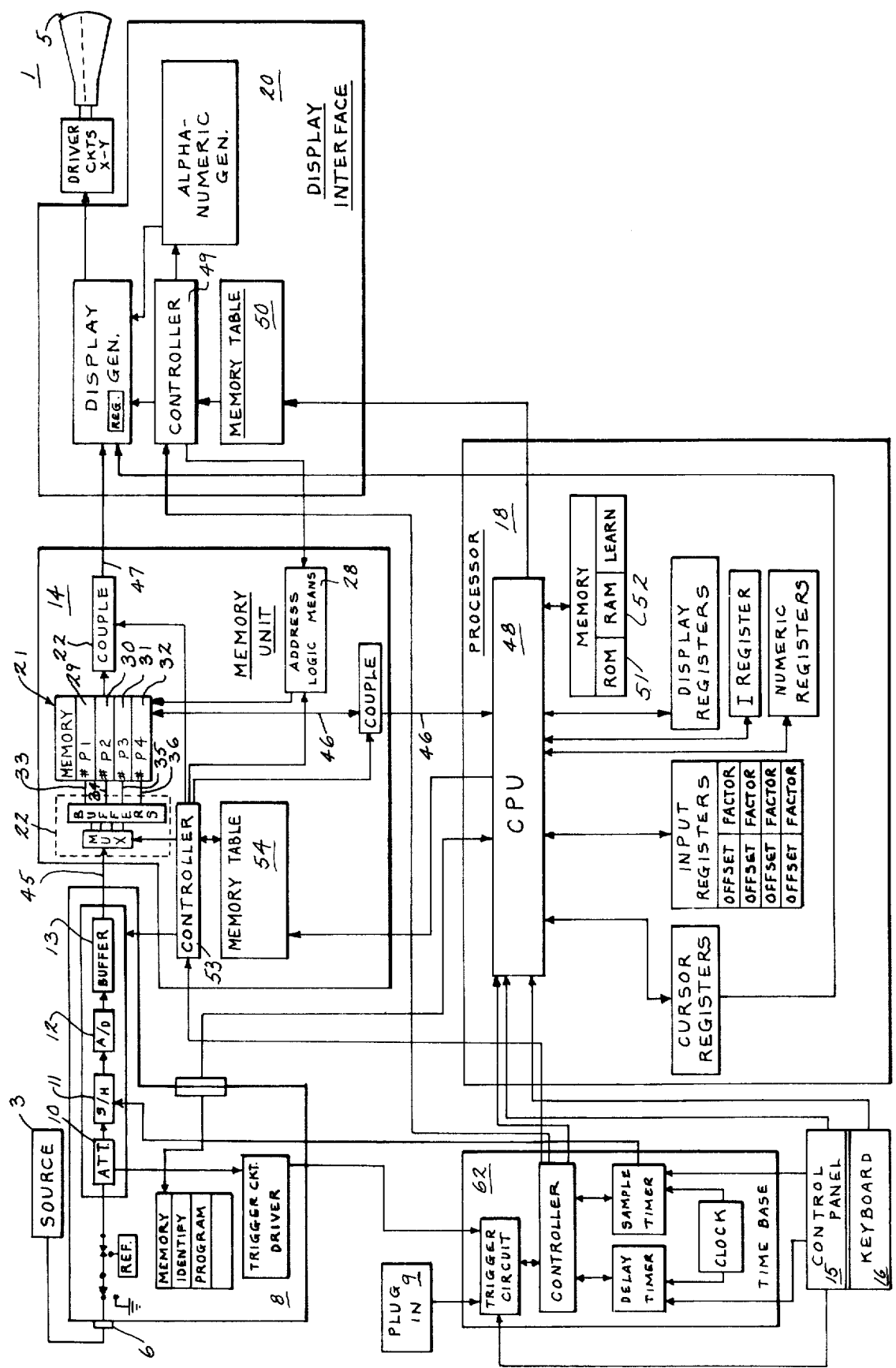
FIG. 3 is a block diagram of the connection of a random access memory unit to a data acquisition means, a display unit and a programmed processor in a preferred embodiment of the present invention.

Referring to the drawings and particularly to FIG. 1, a pictorial view of a waveform display and analyzing instrument constructed in accordance with the present invention is shown including a visual display unit 1 which is preferably a conventional high speed CRT or monitor oscilloscope. The unit 1 is connected to form an integrated element of a programmable processor unit 2 which is adapted to be connected to a waveform source 3 and drive the CRT unit 1 to display related waveforms 4 on the CRT screen 5, as more fully disclosed in the previously identified copending application. The instrument includes a plurality of waveform signal input jacks 6 and 7 each of which may be connected to a waveform signal source 3 for display of the waveforms on screen 5. In the illustrated embodiment a pair of jacks 6 and 7 are shown and a pair of waveform signals may be simultaneously read and displayed. Each jack 6 and 7 is mounted in a plug-in unit 8 and 9, which permits coupling to various types of signal sources by use of an appropriate plug-in. A block diagram of one plug-in unit is shown in FIG. 3 and includes a signal sampling and digitizing interface unit including an attenuator 10, a sample and hold circuit 11, an analog to digital converter 12 and a coupling buffer register 13 which are interconnected to digitize the waveform signal.

The waveform signal is thereby digitized into a series of digital data equivalents which are stored in a unique digital memory unit 14, a preferred embodiment of which is shown in FIGS. 2-6.

The illustrated instrument includes an upper panel 15 with data sampling time and mode controls 15a to control the rate and mode of digitizing the waveform signal. A forwardly extending lower keyboard panel 16 includes a plurality of interactive pre-programmed keys 17. The user operated keyboard keys 17 are connected to a processor 18, shown in FIG. 3, for programmed execution of selective functions on the waveform data, with the keys 17 particularly identified by the known function symbol for functions employed in waveform analysis and reduction. The reduced waveform data is in digitized form and is stored in the memory unit 14. The keyboard 16 includes display selection keys 19 which, in cooperation with display controls 19a on the upper panel provide user selection of the waveform display format.

A display interface unit 20 reads data from the memory unit 14 and returns the data to analog form for display on screen 5 of display unit 1.

The present invention is particularly directed to the construction and connection of the memory unit 14 to store the waveform data. The instrument is therefore only described herein as required to fully describe the present invention. For a fuller description of the other aspects and features of the illustrated embodiments, reference may be made to the previously identified copending application.

Referring to FIG. 3, the waveform memory unit 14 generally includes a digital random access memory bank 21 having a plurality of data storage cells or locations, each of which stores a multiple bit word defining a beam coordinate or location on screen 5. The memory unit 14 also includes a programmed coupling means 22 connecting the memory bank 21 to the buffer registers 13 of the plug-in units 8 and 9 for receiving and storing sequential digitized data samples. The display interface unit 20 is constructed to sequentially read the data memory locations for reconstruction of the digitized waveform on screen 5.

In accordance with the present invention, the memory blank 21 is constructed with a plurality of separate physical parts, labeled as $P_1$ through $P_4$ in FIG. 3, which may be organized in various combinations to form memory sections or arrays. As hereinafter developed, each of the individual parts includes a separate input port for placing data samples in the corresponding part and each further includes a plurality of the memory locations or storage cells for storing a sufficient number of waveform points to present a reproduced waveform on a correspondingly sized portion of the screen 5. The waveform data samples sequentially are placed in sequentially addressed memory locations of configured memory blank 21. The most recent sample is placed in a physical location of a particular section or array as the logical address for display at the right edge of the screen 5 and with the oldest waveform sample in the address for display at the left edge of the screen erased, such that a "live" waveform appears to march across the screen from right to left.

Figure 4:
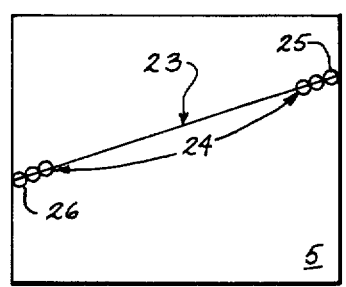
FIG. 4 is an enlarged simplified illustration of the method of presenting the digitized waveform data on the display means.
Figure 4A:
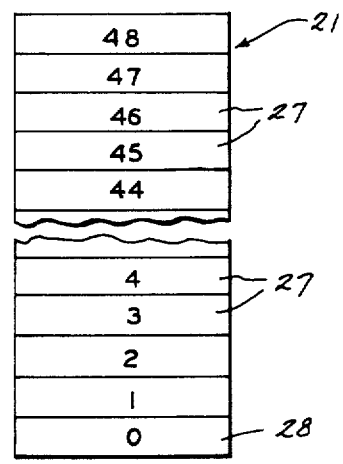
FIG. 4a is a simplified diagrammatic illustration of a random access memory unit for storing digitized waveform data samples.
Figure 2:
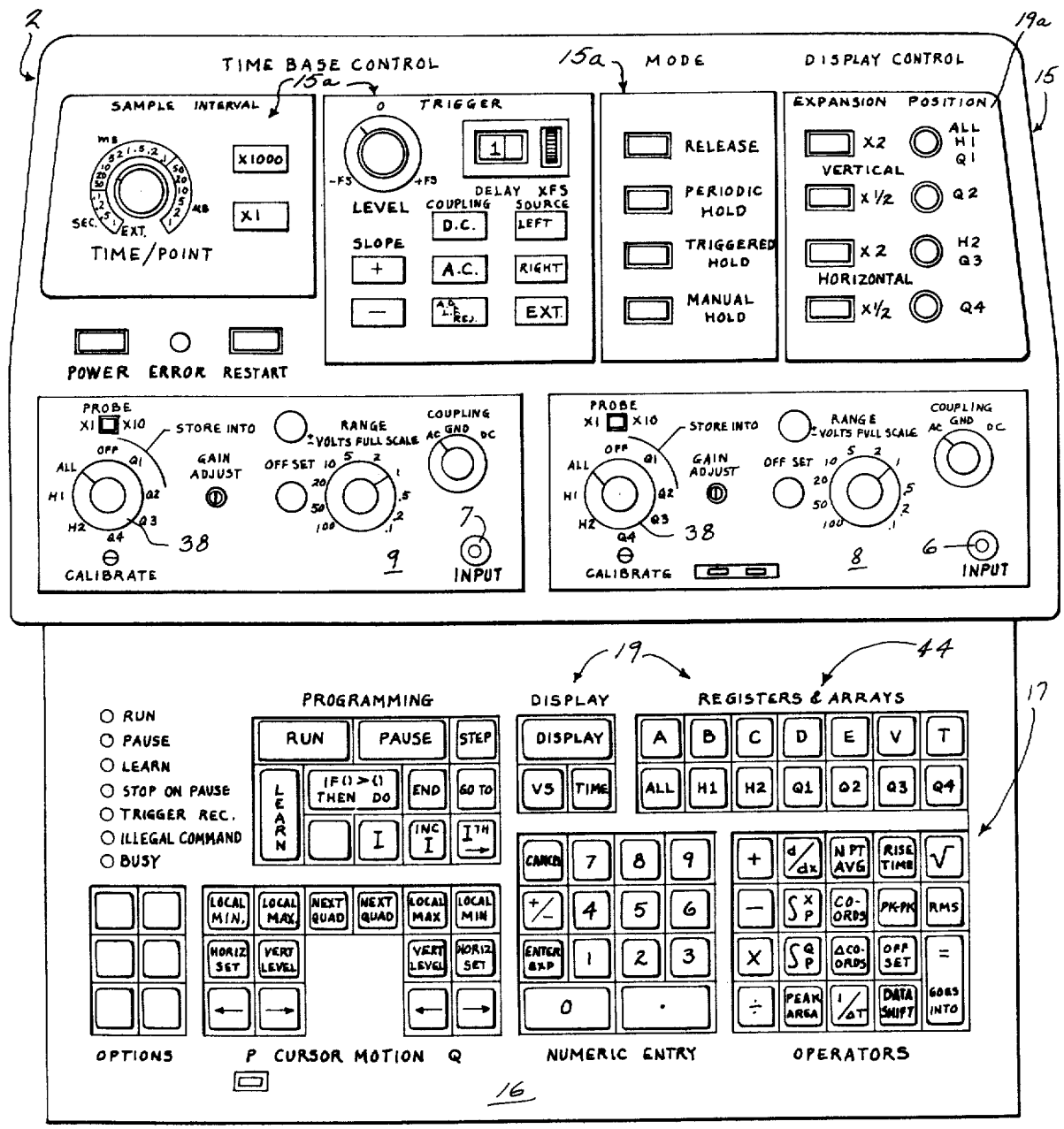
FIG. 2 is an enlarged elevational view of the instrument shown in FIG. 1.

Referring particularly to FIG. 4, for example, a waveform 23 is shown with each word location shown by a dot 24 and with the most recent sample shown by the dot 25 and the oldest sample shown by dot 26. The next sample taken is written in the physical memory location for dot 26 and is then presented at the right edge of the screen, with all other locations or dots 24 shifted one location coordinate or dot to the left. The location of each dot 24 may be defined as the logical address of the data sample for the waveform beginning with the address for dot 26 and each succeeding dot 24 to dot 25 having a corresponding sequential address. The memory bank 21 may be diagrammatically represented as shown in FIG. 4a. Only 49 locations in a ladder-type format and numbered from 0 through 48, which define 49 waveform dot locations, are shown for simplicity of explanation. The numbered locations 27 normally do not, however, correspond to the logical locations of display points or dots 24 on screen 5, i.e., the first location "0" does not necessarily store the value word for the first dot 26 on the left hand edge of the screen. This is true because the taking of data may be arbitrarily terminated. The physical location of logical address zero in memory bank 21 therefore, may not be equal to physical zero, but may be offset according to the number of physical locations that the most current or last sample is offset from the first or zero reference memory location.

In accordance with this invention, the memory unit 14 includes address calculating logic means 28 for tracking this relationship and reading the proper physical location in response to a logical address from the processor 18 and/or the display interfacing unit 20.

As noted above, in accordance with the present invention, any one of the input channels or jacks 6 or 7 may be connected to store digitized waveform data in the total memory bank 21 with the several parts treated as a single section or array, in any one of the individual parts or, in a preferred embodiment, in certain adjacent parts treated as a single memory array. The logic means 28 continuously records the values for relating the physical addresses in each array to the logical address of the array. Reduced waveform data may be similarly stored in a proper sized array of the memory bank 21. The waveform data in the configured array, or arrays, of memory blank 21 may then be read out for display in corresponding relationship on the screen 5 or for processing, with the address calculating logic means 28 providing a continuous proper location within the memory bank 21.

Figure 5:
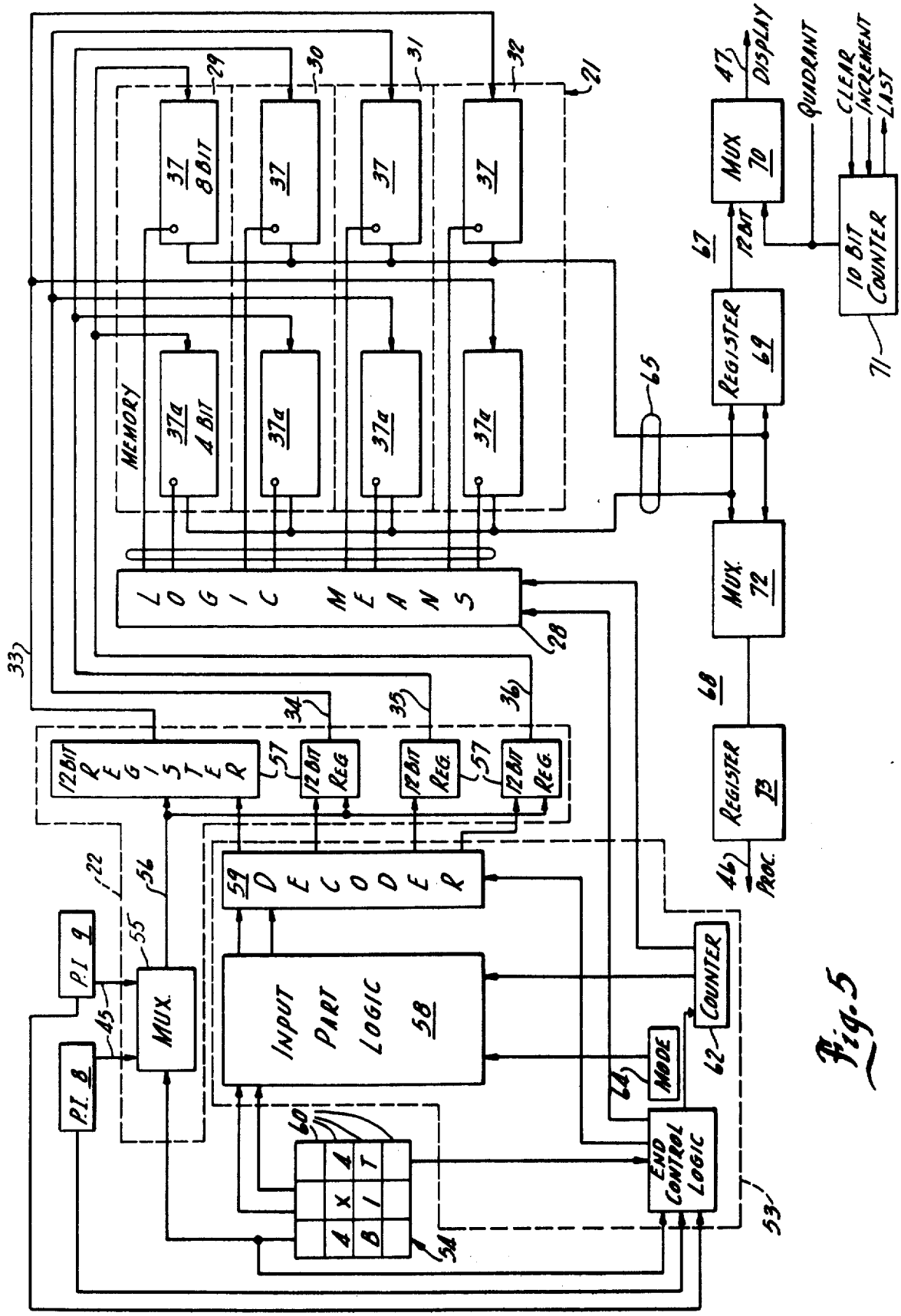
FIG. 5 is a detailed block diagram of the input data system shown in FIG. 3.

More particularly, in the illustrated embodiment, memory bank 21 is shown diagrammatically in FIGS. 3 and 5 including four equal parts 29, 30, 31 and 32 with appropriate individual ports 33, 34, 35 and 36 for storing up to four different waveforms, one in each array. The illustrated four parts 29-32 may consist of memory having 12 bit data words or locations, with each part including an eight bit wide word unit 37 and a four bit wide word unit 37a. The 12 bit wide input ports 33-36 allow simultaneous storage of up to four data samples. The output is a 12 bit wide word which may be read directly by the display interfacing unit. The processor 18 may, in a practical embodiment, read/write in eight bit wide words and is correspondingly coupled to the data memory parts as hereinafter described.

In the illustrated embodiment of this invention, the instrument is constructed with the waveform data sample from any input 6 or 7 connected to be stored within the total memory array 21, within any one of the four parts 29-32, which in the plug-in units 8 and 9 and on the keyboard are identified as quadrant or arrays $Q_1$ through $Q_4$, or within either one of two half sections or arrays identified by the symbols $H_1$ and $H_2$, where $H_1$ equals physical parts 29 and 30 (or $Q_1$ and $Q_2$) and $H_2$ equals physical parts 31 and 32 (or $Q_3$ and $Q_4$). Each part 29-32 may be constructed with 1024 data locations. The total memory bank 21 and the total array would include the 4096 data words and each half memory array would include 2048 data words. Each sized array provides a corresponding number of waveform locations on the screen, having related logical X and Y values.

A memory array selection control knob 38 is provided on the plug-in units 8 and 9 for selecting the memory array, $Q_1$–$Q_4$, $H_1$–$H_2$ or All into which the digitized signal for that input is channeled or routed. The keyboard 16 includes similarly appropriately identified keys 44 for selection of the arrays for display or data reduction Although the illustrated embodiment of the invention illustrates a single waveform signal input means provided in each plug-in, the number may equal the number of memory parts. The instrument is, therefore, designed and constructed to include up to four separate active signal inputs and channels distributed among the plug-in units 8 and 9. In multiple channel systems, a separate set of controls are provided on the front panel of the plug-in unit for control of the signal of each channel or input in accordance with conventional practice for multiple channel plug-in units in conventional or digital oscilloscopes.

Four waveforms stored in the several parts 29–32 may be simultaneously or individually displayed in any position on the CRT screen 5 and in FIG. 1 are shown in four vertically spaced traces, as shown at 39, 40, 41 and 42.

Referring to FIG. 3, the memory unit 14 and particularly total memory bank 21 includes three main ports 45, 46 and 47 which are hardwired to receive and transmit data. Port 45 is a write-only port which is connected to receive the digitized waveform samples from the plug-in units 8–9 and to the programmed connecting means 22 for writing of waveform data in memory bank 21 via the individual part ports 33–36. Port 46 is a read-write port connected to the central processing unit 48 (CPU) of the processor 18 for manipulating the waveform data. The port 47 is a read-only port connected to the display interfacing unit 20, for reading memory and reproducing of the digitized waveform on screen 5.

The processor 18 includes internal programs for communicating with the memory bank 21. The processor 18 addresses the memory bank employing the logical address of the waveform data with respect to the right and left edges of the screen 5, as shown in FIG. 4.

Display interfacing unit 20 similarly includes a sequence controller 49 with a memory table 50 for controlling the waveform display format. The controller 49 also reads the memory bank 21 employing the same logical addresses as those employed by the processor 18. Table 50 is written by the processor 18 to control the waveform presentation.

Generally, the processor 18 is connected to the front control panel 15, to the keyboard panel 16 and to the plug-ins 8 and 9. The processor 18 includes a program memory 51 which may be a read-only memory including the basic program for the CPU and various program for the several user operated inputs of panels 15 and 16 during instrument use. A scratch pad memory 52 is also connected to the CPU 48 for the manipulation of data by the processor. The processor 18 thus functions as the central means for controlling the particular manner of acquiring and displaying waveform information stored in memory unit 14 and is provided with the necessary registers for performing the various data reduction and analysis, as more fully developed in the previously identified copending application.

The memory unit 14 also includes an input sequence memory controller 53 and a memory table 54 connected to and written by the processor 18 to control the routing of data into memory bank 21 and the mode of taking data.

A controller 53 provides a simple and reliable sequencing of the memory unit. If desired, a separate software programmed general purpose processor could, of course, be employed. Thus, "memory table" is generically used to define any type of control means which can itself be controlled by being set or written by the processor 18.

In accordance with this invention, the memory controller 53 also updates the record kept in the logic means 28 of the memory initial or zero time slot location for each array in relationship to the real or physical addresses of the memory bank 21. Whenever a particular logical data location is requested by processor 18 or display interface unit 20, the physical location of the memory bank 21 containing the proper data sample is supplied by converting the logical address to the proper physical address.

Referring particularly to FIG. 5, a block diagram illustrates the flow of data samples into and out of the memory bank 21.

The multiplexer 55 has a pair of input buses 45 connected to plug-in units 8 and 9 and an output bus 56 connected to each input of a set of four multiplexing buffer registers 57, one for each physical part of memory. The data sample may thus be placed in memory part 29–32 via the buses 33–36, each of which may be 12 bits wide. The memory table 54 is connected to a part logic unit 58, the output of which is a two bit part code connected to a two to four decoder 59. The output of decoder 59 is connected to control the setting of one of the registers 57 for placing the data sample in memory.

The memory table 54 is diagrammatically shown as a fast 4 × 4 bit memory having four rows 60 for identifying the source and destination for up to four input channels. Any row may also include an end signal. The source bit in each row is connected to a source multiplexer 55 to properly select the data bus and to the controller 53. The destination bits are connected to the logic unit 58, the output of which is connected to the two to four decoder 59 for activating the registers 57 for proper transfer of data to the desired memory parts 29–32. A counter 62 is incremented by a suitable pulse source in logic unit 53, and is connected as a second input to logic unit 58. The counter 62 tracks the number of samples in relation to the memory size into which the waveform is being placed. A mode input 64 forms a third input to the logic unit 58. The plug-ins include the selection knobs 38, which establish the mode signal connected to the processor 18. The processor in turn writes the mode input 64 on the basis of the collective settings of the selection knobs 38 on the two plug-ins 8 and 9. The mode bits are encoded to define the organization of the memory parts into a single large array, half arrays, or quadrant arrays, and in combination with the destination bits and counter establish the manner of data sampling and storage. The decoder 59 then correspondingly enables the registers 57 in timed relation to the data sampling. The controller 53 reads the table for transferring the data from the input channels and placing data in the appropriate memory section, in accordance with the configuration or organization of the memory sections. Thus, the controller 53 cycles through table 54 to properly enter that data sample into the appropriate register 57 and therefrom into the appropriate memory location in memory bank 21. The current data sample is placed in the location of the oldest data in the particular array. This physical location in the array then acquires the logical address for the right edge on screen 5 and each other logical address is shifted by one physical location.

The address logic means 28 is simultaneously changed to record the new arrangement of the data samples in the array. The memory data is read via a common 12 bit transmission bus 65 including suitable sensing amplifiers, not shown. In the illustrated embodiment employing memory units 37 and 37a for each part 29–32, the bus lines are connected to the several elements. Address logic unit 28 selectively enables the units, as more clearly shown in FIG. 6 and subsequently described, for reading the data words. The waveform data samples can be directed to the display port 47 through a display channel 67 for display or alternately to the processor port 46 through a processing channel 68 for manipulation of the data by processor 18.

The display channel 67 includes a suitable 12 bit latch or register 69 connected to read all 12 bits of a memory location, the output of which is connected by a two to one multiplexer 70 to the display interface 20. The alternate input of the multiplexer 70 is connected to a 10 bit indexing counter 71. Counter 71 is cleared at the start of each quadrant and incremented one for each point in the quadrant. The last index flag marks the end of the quadrant. Multiplexer 70 selectively connects the memory register 69 and the signal from the quadrant lines and the counter 71. The 10 bit counter 71 is incremented for each data point 24 of the display unit 1 in a quadrant to provide a continuous counting and indexing.

For data processing and reduction, the output of the memory bank 21 is coupled to a multiplexer 72 for reading the right memory elements 37 and the left memory elements 37a in separate memory cycles because the described processor 18 has a bus which is eight bit wide. A register 73 couples the memory word to the processor 18.

As previously noted, during the recording of the data samples in the random access memory 21, the memory location is determined as the next word location following the previously filled location. The address logic means 28 maintains a record of the logically defined location in the memory with respect to the particular section or array and with respect to the physical location within such array.

Thus the physical location, in completed form, is defined as the logical address plus the offset of the latest data sample taken plus 1, modulo the array size.

Figure 6:
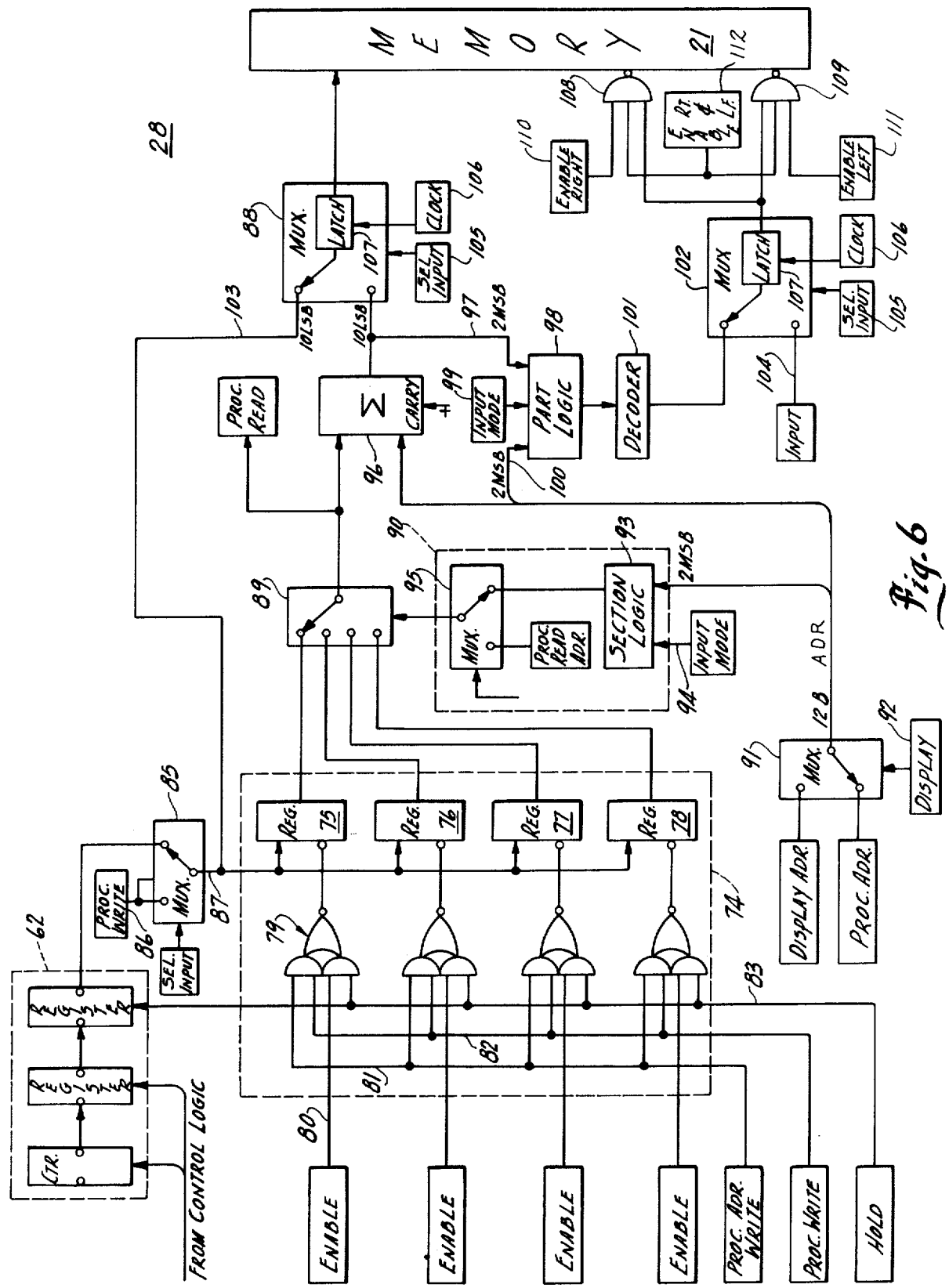
FIG. 6 is a detailed block diagram of an address calculating unit shown in FIG. 3.

An appropriate offset recording system forming a part of a memory address circuit is shown in FIG. 6 wherein an offset register means 74 includes four offset registers 75, 76, 77 and 78, each being adapted to store the amount of the internal memory offset for the respective memory array.

The processor 18 thus configures the parts for channeling the data samples to any one of the possible memory configurations in accordance with the setting of the selection knob 38. The input mode of data acquisition may be any one of the three, namely all, halves or quadrants.

When the several parts are organized as a single total memory section, the offset may, of course, occur any place in any one of the four physical parts of the memory bank 21. The physical boundaries are, removed and a single offset register is employed.

Where the input mode is in halves, the memory bank 21 is similarly configured as two physically separate memories. For example, the first two physical parts 29 and 30 comprise the first memory half and the second two physical parts 31 and 32 comprise the second memory half. The offset for any given half may occur within any physical location within the two physical parts forming such half. The offset cannot, however, cross between the halves as a result of the configuration of the memory bank into two distinct memories. Similarly, in a quadrant mode, each of the physical parts is one of the logical quadrants or sections, and the offset for that section can only occur within such physical part. Where data samples of separate waveforms are placed, one waveform in each of the four quadrants, each of the quadrants is provided with a separate offset register which records the offset of such data samples with respect to its zero physical location in the memory parts.

Referring particularly to FIG. 6, the address calculating logic means is illustrated for setting the offset registers 75-78 and for combining the memory established offset with the logical addresses established by the display controller 49 or the processor 18.

In FIG. 6, registers 75-78 are shown as 12 bit data latch registers, each of which is similarly constructed. Thus, referring to register 75, a four input logic gate 79 is connected to an enable signal line 80 for the corresponding section or array of memory bank 21. The gate 79 further includes a processor address write line 81, a processor write line 82 and a hold line 83, for writing into the associated register 75.

The offset registers 75-78 further have a data input connected to the memory counter means 62 which initiates a count upon the taking of samples into the memory. The counter means 62 thus maintains a record of sampling for sequencing from one location to the next within the memory bank 21.

A two to one multiplexer 85 selects between a first position interconnecting the output of the counter means 62 and a second position interconnecting the processor write bus 86 to a common bus 87 which is connected to registers 75-78 and to multiplexer 88 for addressing memory bank 21. With the multiplexer 85 set to the counter means 62, the enabled registers 75-78 are set simultaneously for each data sample by the hold line 83.

The output of the offset registers 75-78 are connected to a four to one offset multiplexer 89 having the four inputs connected respectively to the 12 bit output busses from each of the four registers 75-78. The multiplexer 89 is set by a section request logic circuitry 90 controlled by establishing a logical display address or logical processor address at the input of a two to one multiplexer 91. The multiplexer 91 includes a select display input 92 established by the memory controller.

Generally, the memory unit 14 is designed with a priority assigned to memory access. Sampling is preferably given top priority, processing second priority and displaying third or last priority. The user thus actuates the desired keys and the processor 18 and display interface unit 20 receive the next available memory cylce in accordance with the designed priority.

The output of multiplexer 91 is a 12 bit logical address word for both the processor 18 and the display unit 1. The two most significant bits are coupled through a request section logic unit 93. The other input 94 of unit 93 is connected to a two bit input mode code as set by the processor 18 to establish a proper setting of the offset multiplexer 89. The output of unit 93 is connected by a two to one multiplexing unit 95 as the control input to the multiplexer 89. The alternate input of the unit 95 is connected directly to the processor read address for reading the memory registers 75-78 by the processor 18.

The multiplexer 89 is thereby set in accordance with the input mode and the quadrant conditions such that the offset for a particular array or section appears at its output.

The 12 bit output word of the multiplexer 89 defines the value of the offset and is connected to one 12 bit input of a three input adder 96, the other 12 bit input of which is connected directly to the logic address lines from the processor-display address multiplexer 91. The adder 96 includes a one carry input as the third input such that the output of the adder properly defines the physical location for the defined requested logical address.

The output of adder 96 has the 10 least significant bits connected as one input to the multiplex-register 88 for addressing the memory bank 21. The two most significant bits are employed to enable the proper parts of memory bank 21.

The output of the adder 96 and particularly the two most significant bits form one input 97 to a physical part logic unit 98. An input mode signal is appled as a second input 99. A third input 100 is connected to the two most significant bits directly from the logical address line. The output of the physical parts logic unit 98 is a two bit output identifying the particular physical part of the memory bank 21 to which the logical address applies. The 10 least significant bits are the physical location address within a particular part with the two most significant bits as the part location address or selection. The latter information is combined with the input mode and the two most significant bits of the logical address in the part logic unit 98.

The two bit binary line is connected to a two to four line decoder 101 establishing a four bit word precisely identifying the part 29-32 of the memory bank 21 in which the desired data value is located. The output is connected to a multiplexer and latch unit 102 for enabling the appropriate memory part 29, 30, 31 or 32. The address multiplexer-latch units 88 and 102 are similar two to one multiplexing elements which in addition to the address logic selecting inputs just described, further have alternate inputs connected to permit addressing particular memory locations for storing waveform data into memory. Thus, multiplexer unit 88 has a 10 bit input bus 103 connected directly to the output of the multiplexer 85 and the multiplexer 102 has a four bit input bus 104 connected to a part code input from unit 53. Each unit 88 and 102 has a similar select input 105 for setting the addressing between the one input for display and processing and the second input for storing waveform data into memory bank 21, and a cycle clock input 106 to the latch registers 107 for timed operation during the memory cycle.

The output of unit 102 is connected to enable the right and/or left bytes of the address words, depending upon whether the addressing is from the display interface unit 20, the processor 18, or the input control 53.

In the illustrated embodiment, the output of logic unit 102 is simultaneously impressed on one input of each of a pair of three input NAND gates 108 and 109 for each part. The second input of gate 108 is connected to a right enable signal unit 110 to enable element 37a of the appropriate part and the second input of gate 109 is connected to a left enable signal unit 111 to enable element 37. The third inputs are connected to each other and to common enable signal unit 112 to enable both elements 37 and 37a. Where the processor 18 is addressing the memory bank 21, two memory cycles are required to sequentially read elements 37 and 37a, with the eight bit data words placed in the register 73 of FIG. 5. When the display interface unit 20 is addressing memory bank 21, a single memory cycle places the complete 12 bit data word in register 69.

In summary, the address calculating logic unit 28 provides a continuous record of the offset values for each set of waveform samples in the memory bank 21.

The processor 18 or the display interface unit 20 may address the memory unit 14 using logical addresses and obtains the proper data even though the data is arbitrarily located within the particular section or array. Similarly, when reduced waveform data is to be placed in memory bank 21 the processor 18 addresses the waveform memory employing logical addresses.

The present invention thus permits use of a random access memory system which may be configured in any one of a pluarlity of operative physical arrangements for efficient use of the memory array and without restriction as to termination of sample taking.

Various modes of carrying out the invention are contemplated as being within the scope of the following claims, particularly pointing out and distinctly claiming the subject matter which is regarded as the invention.

I claim:

1. In a waveform measuring instrument, comprising a digital random access memory means having a plurality of addressable physical memory cell means, a waveform signal input means connected to said digital random access memory means to sample a waveform signal and digitizing said signal waveform samples into digital representation data and storing said digital representation data in said memory cell means, said random access memory means including a plurality of memory parts, each of said parts including a plurality of said physical memory cell means and an input port means for writing waveform data into said cell means, control means for selectively connecting said signal input means to said input port means and addressing the memory locations for continuously writing into the memory cell means of the parts connected to said input port means in a continuous cyclical writing sequence, said control means including first means for logically connecting said parts into a plurality of individual memory arrays and connecting one of said input port means for storing an independent waveform composite into one of the parts and second means to logically connect said parts into a composite array consisting of two or more of the parts, said composite array being capable of accepting independent waveform representation data in said cyclical sequence for storing an independent waveform composite into said composite array.

2. In the waveform measuring instrument of claim 1 wherein each memory part has an initial physical memory cell means and a final physical memory cell means, means connected to said input means to arbitrarily terminate said continuous cyclical writing sequence, whereby said newest waveform data may be located in any of the physical memory cell means of an array, said memory cell means having logical addresses ending with the newest waveform data, said control means including cell means storage means for maintaining data of the physical location of the cell means of the newest data with respect to said initial physical memory cell means and providing offset data of the memory offset from the initial physical memory cell means for said logical addresses, and memory reading means connected to said random access memory means and to said storage means for reading said memory cell means, said reading means including logical address means addressing said memory means in said logical addresses and having address logic means combining said logical addresses and the data in said storage means for selecting the physical cell means storing the waveform representation corresponding to the logical address.

3. In the waveform measuring instrument of claim 1 including read means having addressing means for addressing said random access memory means with logical addresses, one for each of said cell means and ending with the newest digital representation data written into the memory means, and wherein the writing of data representations into the memory cell means in a continuous cyclical sequence is terminated with any sample, said control means including storage register means storing a signal related to the location of cell means of the newest data sample with respect to the initial physical cell means of the memory parts.

4. The waveform measuring instrument of claim 3 wherein said storage register means includes a separate storage register for each part of said memory means for storing a signal for each part, selected registers being connected to store a signal for each composite array.

5. The waveform measuring instrument of claim 4 wherein said memory means includes at least four memory parts adapted to be configured into a single four part memory having the digital representation data entered into sequentially addressed memory cell means, a pair of separate half two part memories forming a pair of half composite arrays, one of said registers being used for storing the memory offset value for each single memory, and a pair of said registers being used for storing the memory offset values, one each for each of said half composite arrays.

6. The waveform measuring instrument of claim 1 wherein said control means includes part logic means connected to said input port means and having a plurality of inputs including an input part encoder input encoded in accordance with the memory part connections and a part designation input for selecting the input port and a counting means to sequence the samples to the memory means in the memory parts, a plurality of storage means connected to receive digitized samples of different waveforms and connected one each to the input port means of each memory part, and means connecting said part logic means to enable one of said storage means and introducing the digitized waveform sample from said one of said plurality of storage means into the connected memory part.

7. The waveform measuring instrument of claim 6 wherein said control means includes an part encoder means including an input selection memory means encoding the connections to the storage means and having a resident processor connected to the input program memory means for reading and writing said program memory means for establishing the part connections to form said arrays.

8. The waveform measuring instrument of claim 7 including a multiplexer having a plurality of signal waveform inputs and a single output connected to each of said storage means for introducing of a digitized representation from any one of said waveform inputs to all of said storage means.

9. In the waveform measuring instrument of claim 7 including a display means having means to sequentially read said memory means, said read means includes an address logic means having means to convert the logical address of the display means to the physical address in said memory means in accordance with the memory offset in said storage register means, a part logic means connected to said address logic means and said memory part connection control and designation bits of said addresses to selectively enable said memory parts, output bus means connected to the several parts for transmitting the addressed location to said memory means for addressing of a memory cell means.

10. In the instrument of claim 9 including means for connecting said processor to read and write in said storage means.

11. In the instrument of claim 9 wherein said logical address means includes part identifying bit lines and said storage means includes a separate register for each memory part, each register having a count input connected to an enable input means to selectively increment said register, an offset multiplexer connected to said registers and having an offset output, a part logic means having a part connection input connected to a signal means and a part input connected to the logical address means and connected to said offset multiplexer, said multiplexer being operable to connect said multiplexer output to one of said registers, an adder connected to said multiplexer output and to the logical address means, and hence being active to generate a physical address of the memory cell means for a logical address, a part logic means having a plurality of inputs connected to the part signal means and to the part identifying bit lines of the logic address means and to the output of the adder and having a multiple bit output defining the memory part, and a decoder connected to the part logic means to provide an individual enable line for each memory part.

12. In the instrument of claim 11 wherein said processor is connected to write into said random access memory means, and having multiplexing means for connecting the processor to said registers and to said random access memory means and simultaneously disconnecting the adder and the part logic means.

13. In a waveform measuring and analyzing instrument having a CRT display means with a beam means adapted to be located in accordance with coordinate means on a screen and a waveform digitizing means having a wave input means and means for sampling of waveform signals in time spaced sample periods and for digitizing successive samples of the waveform signals, a digital random access memory bank having a plurality of memory cells defining a plurality of display points, said memory bank including a plurality of input port means connected to divide the memory bank into a plurality of physical parts, a multiplexer having a signal output port connected to each memory input port means and having a plurality of signal input ports adapted to simultaneously receive digitized waveform samples from the input means, a controller having input means for connecting the signal input port means to the signal output ports for placing successive waveform samples in successive memory locations in said memory bank, a programmed processor connected to said memory means and adapted to perform calculations and mathematical operations on said waveform data to establish modified waveform data and to store the modified data in the memory bank, a counter means continuously counting the memory cell location in synchronism with the introduction of the digitized signals and thereby establishing a continuous offset value of each signal in the memory bank from the physical zero location of the newest data memory location, said display means and said processor addressing said memory bank with logical addresses corresponding to the presentation on said viewing means, and an address calculating logic means including means for selectively combining the offset value with the logical address to form an actual physical cell address.

14. In the waveform measuring instrument of claim 13 wherein a separate offset register is provided for each of said plurality of memory parts and selectively connected to said counter means to store an offset value, a multiplexer being connected to the outputs of all said registers and having an input for selecting one of said registers, a summing unit having an input connected to said multiplexer, a logical address multiplexer connected to said processor and to said display means and having an output connected to the second input of the summing unit, and a part logic unit connected to said summing unit and to a part connection input and to said logical address multiplexer to define the physical part containing said actual physical cell address.

* * * * *